United States Patent
Zhao et al.

(10) Patent No.: US 7,431,961 B2
(45) Date of Patent: Oct. 7, 2008

(54) COMPOSITE FREE LAYER FOR CIP GMR DEVICE

(75) Inventors: Tong Zhao, Milpitas, CA (US); Hui-Chuan Wang, Pleasanton, CA (US); Yun-Fei Li, Fremont, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 598 days.

(21) Appl. No.: 11/010,105

(22) Filed: Dec. 10, 2004

(65) Prior Publication Data

US 2006/0126231 A1 Jun. 15, 2006

(51) Int. Cl.
*B05D 5/12* (2006.01)

(52) U.S. Cl. .............. 427/127; 427/131; 427/132; 427/599; 360/324; 428/827

(58) Field of Classification Search .......... 427/127, 427/131, 132, 599; 360/324; 29/603
See application file for complete search history.

(56) References Cited

U.S. PATENT DOCUMENTS

| | | | |
|---|---|---|---|
| 5,858,455 A * | 1/1999 | Chambliss et al. .......... 427/131 |
| 5,896,252 A | 4/1999 | Kanai .......................... 360/113 |
| 6,034,847 A * | 3/2000 | Komuro et al. .............. 360/126 |
| 6,038,107 A | 3/2000 | Pinarbasi ..................... 360/113 |
| 6,123,780 A | 9/2000 | Kanai et al. .................. 148/108 |
| 6,352,621 B1 | 3/2002 | Saito et al. ................ 204/192.2 |
| 6,466,417 B1 | 10/2002 | Gill ........................ 360/324.12 |
| 6,517,896 B1 | 2/2003 | Horng et al. ................. 427/123 |
| 6,608,740 B2 | 8/2003 | Tanaka et al. ........... 360/324.12 |
| 6,611,034 B2 | 8/2003 | Den ............................ 257/421 |
| 6,614,630 B2 | 9/2003 | Horng et al. ............ 360/324.12 |
| 6,885,527 B1 * | 4/2005 | Ju et al. .................... 360/324.1 |
| 2003/0193761 A1* | 10/2003 | Cornwell et al. ........ 360/324.12 |
| 2007/0281079 A1* | 12/2007 | Carey et al. .................. 427/131 |

* cited by examiner

*Primary Examiner*—Alain L Bashore
(74) *Attorney, Agent, or Firm*—Saile Ackerman LLC; Stephen B. Ackerman

(57) ABSTRACT

In this invention, we replace low resistivity NiFe with high-resistivity FeNi for the FL2 portion of a composite free layer in a CIP GMR sensor in order to minimize current shunting effects while still retaining both magnetic softness and low magnetostriction. A process for manufacturing the device is also described.

16 Claims, 1 Drawing Sheet

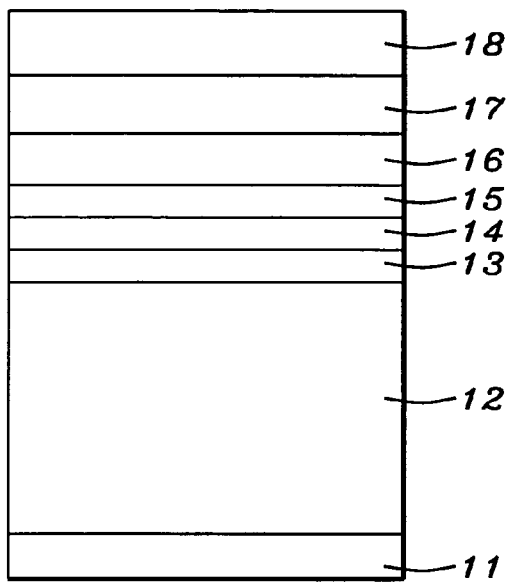
FIG. 1 - Prior Art
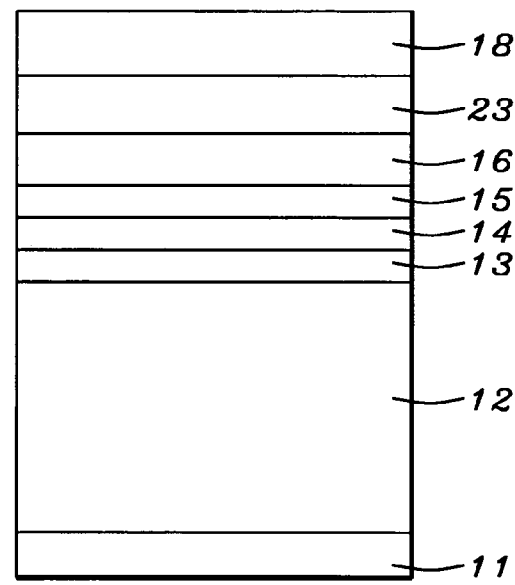
FIG. 2
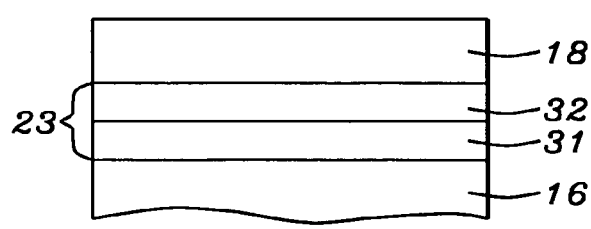
FIG. 3

COMPOSITE FREE LAYER FOR CIP GMR DEVICE

FIELD OF THE INVENTION

The invention relates to the general field of CIP GMR read heads with particular reference to the free layer sub-structure.

BACKGROUND OF THE INVENTION

The principle governing the operation of most magnetic read heads is the change of resistivity of certain materials in the presence of a magnetic field (magneto-resistance or MR). Magneto-resistance can be significantly increased by means of a structure known as a spin valve where the resistance increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are illustrated in FIG. 1. They are seed layer 11 (lying on lower conductive lead 10) on which is antiferromagnetic layer 12 whose purpose is to act as a pinning agent for a magnetically pinned layer. The latter is a synthetic antiferromagnet formed by sandwiching antiferromagnetic coupling layer 14 between two antiparallel ferromagnetic layers 13 (AP2) and 15 (AP1).

Next is a non-magnetic spacer layer 16 on which is low coercivity (free) ferromagnetic layer 17. A contacting layer such as lead 18 lies atop free layer 17. When free layer 17 is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field.

If the direction of the pinned field is parallel to the free layer, electrons passing between the free and pinned layers suffer less scattering. Thus, the resistance in this state is lower. If, however, the magnetization of the pinned layer is anti-parallel to that of the free layer, electrons moving from one layer into the other will suffer more scattering so the resistance of the structure will increase. The change in resistance of a spin valve is typically 8-20%.

GMR devices may be designed so as to measure the resistance of the free layer for current flowing parallel to its two surfaces. This is referred to as a CIP (current in plane) device.

Instead of being a single layer, free layers that are laminates of several layers have begun to be used in magnetic recording heads. For example, $Co_{90}Fe_{10}/Ni_{80}Fe_{20}$, A typical composite free layer usually consists of two magnetic layers, a first free layer (FL1) and second free layer (FL2), which are directly magnetically coupled to one another. FL1 (usually Co-rich alloys) provides strong spin dependent scattering, while FL2 (usually permalloy-type (NiFe) material) provides magnetic softness (i.e. low coercivity).

When compared with a free layer of only CoFe, a composite free layer has the following advantages: 1) Better magnetic softness can reduce noise and enhance the sensitivity of GMR sensor. 2) Magnetostriction can be easily adjusted by changing the thickness ratio of $Ni_{80}Fe_{20}$ to $Co_{90}Fe_{10}$. However, a major drawback of composite free layers of the current and prior art is their low dR and dR/R in a CIP configuration because $Ni_{80}Fe_{20}$, with relatively low spin polarization and low resistivity, significantly contributes to shunting effects while top specular (or spin filter) schemes, such as CoFe\Cu\Oxide or CoFe\Oxide, cannot be applied in this case.

A routine search of the prior art found the following references to be of interest:

In U.S. Pat. Nos. 6,614,630 and 6,517,896 (Horng et al) show conventional CoFe/NiFe free layers. Gill teaches alternating CoFe and NiFe films to form the free layer in U.S. Pat. No. 6,466,417. In U.S. Pat. No. 6,038,107 Pinarbasi discloses a composite Co/NiFe free layer while Den discloses FeNi in the ferromagnetic layer in U.S. Pat. No. 6,611,034.

Tanaka et al. describe a $Co_{70}Fe_{15}Ni_{15}$ free layer having a ratio of 70:15:15 U.S. Pat. No. 6,608,740. In U.S. Pat. No. 6,123,780, Kanai et al) show a FeNi/CoFeB free layer but give no details on the Fe composition of the layer. In U.S. Pat. No. 5,896,252, Kanai describes a spin valve that includes two sub-layers and, in U.S. Pat. No. 6,352,621, Saito et al. disclose a FeNi free layer but give no details on the Fe composition of the layer.

SUMMARY OF THE INVENTION

It has been an object of at least one embodiment of the present invention to provide a CIP GMR magnetic read head having improved performance.

Another object of at least one embodiment of the present invention has been to provide a process for manufacturing said read head.

Still another object of at least one embodiment of the present invention has been that said process be compatible with existing processes for the manufacture of CIP GMR devices.

These objects have been achieved by replacing the conventional free layer with a composite layer that includes at least two layers, one of which is CoFe while the other is a ferromagnetic material having at least 60 atomic percent of iron as well as a resistivity of at least 35 micro-ohm cm. Additional elements may be added to this layer in order to maximize this resistivity value. The result is an improved CIP GMR device that has a higher GMR ratio than prior art devices, while still maintaining free layer softness and acceptable magnetostriction. A process for manufacturing the device is also described.

BRIEF DESCRIPTION OF THE DRAWINGS

FIG. 1 shows a GMR stack of the prior art which has a conventional free layer.

FIG. 2 shows a GMR stack according to the teachings of the present invention.

FIG. 3 is a more detailed version of the structure shown in FIG. 2.

DESCRIPTION OF THE PREFERRED EMBODIMENTS

In conventional (standard) CPP spin valve structures, composite free layers made of $CoFe_{(10\%)}$ and $NiFe_{(19\%)}$ have been used. Such films are supposedly non magnetostrictive (i.e. the magnetostriction coefficient is around $10^{-7}$. For CoFe films, magnetostriction increases with higher Fe composition while for NiFe films, negative magnetostriction is obtained at lower Fe concentrations. The present invention takes advantage of these characteristics by increasing both the percentage of iron in the NiFe portion of this laminate as well as its resistivity, thereby improving the CIP GMR while still maintaining free layer softness and acceptable magnetostriction.

Referring now to FIG. 2, we provide a description of the process of the present invention. In the course of this description, the structure of the present invention will also become apparent.

The process begins with the formation of seed layer 11 onto which is deposited pinning layer 12. Layer 12 comprises a suitable antiferromagnetic material such as IrMn and it is deposited to a thickness between 20 and 100 Angstroms. Layer 13 (known as AP2), the first of the two antiparallel layers that will form the synthetic AFM pinned layer, is then deposited onto layer 12. This is followed by layer of AFM coupling material 14 and then AP1 layer is deposited thereon. Next, non-magnetic spacer layer 16 is deposited on AP1 layer 15.

Now follows a key feature of the invention whereby free layer 23 is formed by successive deposition of at least two layers, one of which is CoFe (deposited to a thickness between about 5 and 30 Angstroms) while the other is a ferromagnetic material having a resistivity of at least 35 micro-ohm cm and containing at least 60 atomic percent of iron. It is deposited to a thickness between about 10 and 40 Angstroms. in addition to iron and nickel, this layer of ferromagnetic material may also include one or more additional elements such as B or V, that serve to increase the resistivity. The total thickness of free layer 23 should be between about 15 and 70 Angstroms.

The two layers that make up the free layer are schematically illustrated in FIG. 3 as layers 31 and 32 respectively but it should be noted that the invention will function equally well if the order of their deposition is reversed (such as in top and bottom spin valves). It should also be noted that additional layers of CoFe and/or Fe rich NiFe could be added to the free layer to bring about further improvements in device performance.

The process concludes with the deposition of capping layer 18 on composite free layer 23, thereby forming the read head. If the process described above was correctly used to form the read head it will be found to have a GMR ratio of at least 14%, a coercivity that less than about 4 Oe, and a magnetostriction constant that less than about $2 \times 10^{-6}$.

Confirmatory Results

TABLE I below compares the properties of a conventional (reference) GMR structure with one whose free layer was made according to the teachings of this invention Except for FL2, the other parts of the GMR stack are kept the same. Also we intentionally matched the magnetic moments of the free layers in these two structures for a fair comparison. The number after each named layer is thickness in Angstroms: The basic structure, common to both A and B below, was:

Seed layer\Antiferromagnetic layer\CoFe\Ru\CoFe\Cu\CoFe(FL1)\FL2\Capping layer. In sample A, FL2 is permalloy($Ni_{80}Fe_{20}$) while in sample B it is and $Fe_{88}Ni_{32}$:

TABLE 1

| Sample | R | dR/R | dR | Bs | Hc | He | Lambda |
|--------|------|-------|------|-------|------|------|---------|
| A | 21.5 | 14.6% | 3.13 | 0.250 | 11.7 | 29.1 | 2.0E−06 |
| B | 24.2 | 14.6% | 3.54 | 0.259 | 3.1 | 32.7 | 3.0E−07 |

It can be seen that, the advantages of the invention structure are:
1) High dR
2) Low Hc
3) Low magnetostriction Manufacture of the invented structure requires only a target of new material to replace the current NiFe target used for GMR stack sputtering and the annealing process can be kept the same. Therefore, there is no change of the current process flow and/or related processes.

What is claimed is:

1. A method to form a free layer in a CIP GMR device, comprising:

successively depositing at least two layers, one of which is CoFe while the other is a ferromagnetic material having a resistivity of at least 35 micro-ohm cm and containing at least 60 atomic percent of iron.

2. The method of claim 1 wherein said layer of CoFe is deposited to a thickness of between about 5 and 30 Angstroms.

3. The method of claim 1 wherein said layer of ferromagnetic material is deposited to a thickness of between about 10 and 40 Angstroms.

4. The method of claim 1 wherein said free layer is deposited to have a total thickness of between about 15 and 70 Angstroms.

5. The method of claim 1 wherein said layer of ferromagnetic material contains, in addition to iron and nickel, one or more elements selected from the group consisting of B and V, said elements serving to increase said resistivity.

6. A process to manufacture a CIP GMR read head, comprising:

depositing, in unbroken succession, a seed layer and a pinning layer;

on said pinning layer, depositing a pinned layer;

depositing a non magnetic spacer layer on said pinned layer;

on said non magnetic spacer layer, depositing a free layer through successive deposition of at least two layers, one of which is CoFe while the other is a ferromagnetic material having a resistivity of at least 35 micro-ohm cm and containing at least 60 atomic percent of iron; and on said free layer, depositing a capping layer, thereby forming said read head.

7. The process recited in claim 6 wherein said layer of CoFe is deposited to a thickness of between about 5 and 30 Angstroms.

8. The process recited in claim 6 wherein said layer of ferromagnetic material is deposited to a thickness of between about 10 and 40 Angstroms.

9. The process recited in claim 6 wherein said free layer of is deposited to have a total thickness of between about 15 and 70 Angstroms.

10. The process recited in claim 6 wherein said layer of ferromagnetic material contains, in addition to iron and nickel, one or more elements selected from the group consisting of B and V, said elements serving to increase said resistivity.

11. The process recited in claim 6 wherein said layer of ferromagnetic material is deposited prior to said layer of CoFe.

12. The process recited in claim 6 wherein said layer of CoFe is deposited prior to said layer of ferromagnetic material.

13. The process recited in claim 6 wherein said CIP read head has a GMR ratio of at least 14%.

14. The process recited in claim 6 wherein said free layer has a coercivity that less than about 4 Oe.

15. The process recited in claim 6 wherein said free layer has a magnetostriction constant that less than about $2 \times 10^{-6}$.

16. The process described in claim 6 wherein said pinned layer is a synthetic antiferromagnet that comprises oppositely magnetized ferromagnetic layers separated by an antiferromagnetic coupling layer.

* * * * *